US012525960B2

(12) United States Patent
Voo et al.

(10) Patent No.: US 12,525,960 B2
(45) Date of Patent: Jan. 13, 2026

(54) PHASE SHIFTER CIRCUIT OF OPTICAL ENCODER AND OPERATING METHOD THEREOF

(71) Applicant: PIXART IMAGING INC., Hsin-Chu County (TW)

(72) Inventors: Chuang-Shen Voo, Penang (MY); Kuan-Choong Shim, Penang (MY); Gim-Eng Chew, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 65 days.

(21) Appl. No.: 18/406,420

(22) Filed: Jan. 8, 2024

(65) Prior Publication Data
US 2025/0226814 A1    Jul. 10, 2025

(51) Int. Cl.
*H03H 11/00* (2006.01)
*G01D 5/347* (2006.01)
*H03H 7/48* (2006.01)
*H03H 11/20* (2006.01)
*H03H 17/08* (2006.01)

(52) U.S. Cl.
CPC ......... *H03H 11/20* (2013.01); *G01D 5/34776* (2013.01); *H03H 7/48* (2013.01); *H03H 17/08* (2013.01)

(58) Field of Classification Search
CPC .......... H03K 5/13; H03K 5/131; H03K 5/134; H03K 5/15; H03K 5/151; H03K 5/1515; H03K 2005/00286; G01D 5/34776; G01D 5/3473; G01D 5/247; G01D 5/3407
See application file for complete search history.

(56) References Cited

U.S. PATENT DOCUMENTS

| | | | | |
|---|---|---|---|---|
| 4,410,798 | A * | 10/1983 | Breslow ................ | H03M 1/305 341/11 |
| 11,073,413 | B2 * | 7/2021 | Thor ................... | G01D 5/24476 |
| 11,108,385 | B1 * | 8/2021 | Thor ....................... | H03K 5/13 |
| 2016/0294364 | A1 * | 10/2016 | Kiriyama ............... | H03H 11/22 |
| 2022/0341961 | A1 * | 10/2022 | Thor ....................... | G01P 3/486 |
| 2024/0162607 | A1 * | 5/2024 | Liu .......................... | H01Q 3/36 |

* cited by examiner

*Primary Examiner* — Tuan T Lam
(74) *Attorney, Agent, or Firm* — HAUPTMAN HAM, LLP

(57) ABSTRACT

There is provided a phase shifter circuit of an optical encoder. The phase shifter circuit receives a first signal, a second signal, a third signal and a fourth signal sequentially having a 90-degree phase shift, and includes a first cascaded resistor string, a second cascaded resistor string, a third cascaded resistor string and a fourth cascaded resistor string. The first, second, third and fourth cascaded resistor strings respectively delay the first, third, second and fourth signals by selecting a switch connected at a tap-out node of the first, second, third and fourth cascaded resistor strings to correct phase deviations between incremental signals and an index signal and/or between incremental signals.

18 Claims, 13 Drawing Sheets

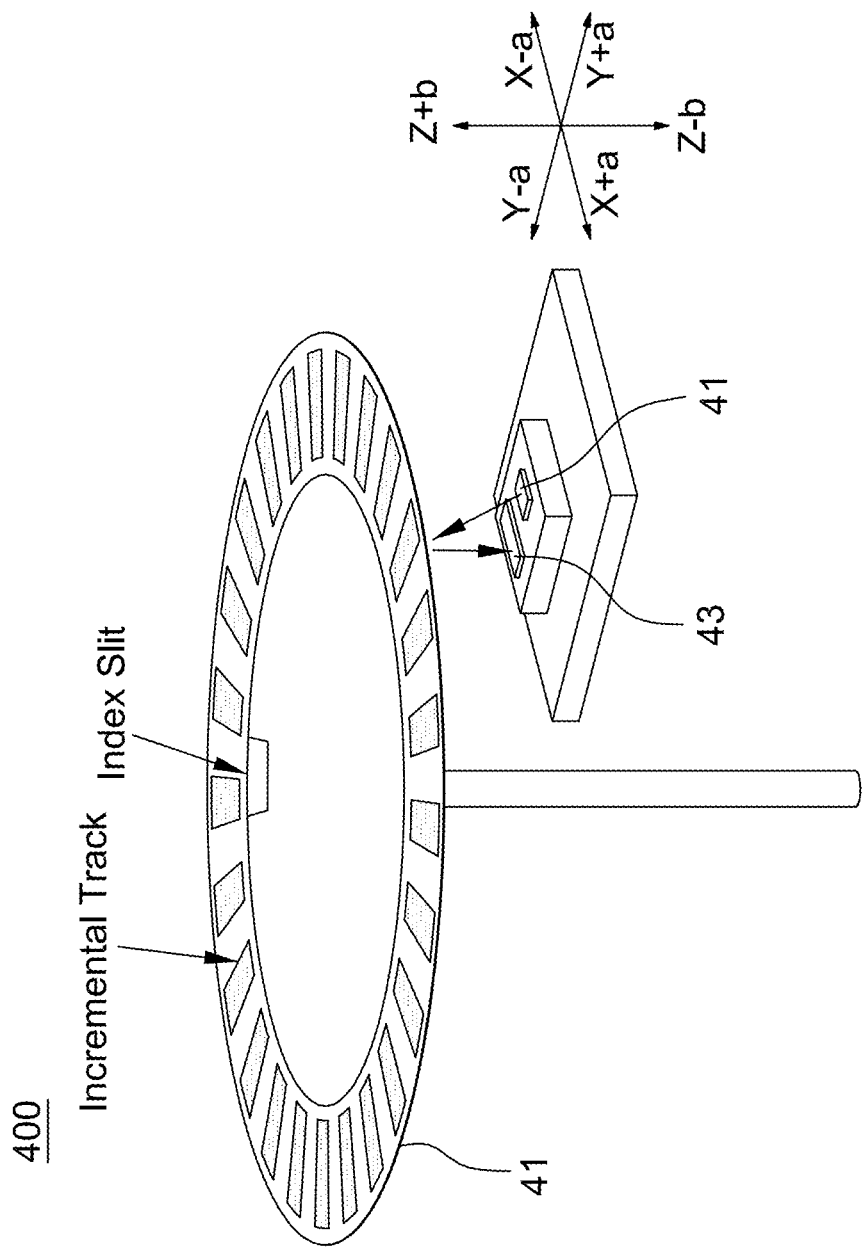

PHASE SHIFTER CIRCUIT OF OPTICAL ENCODER AND OPERATING METHOD THEREOF

FIELD OF THE DISCLOSURE

This disclosure generally relates to an incremental optical encoder and, more particularly, to a phase shifter circuit of an incremental optical encoder that calibrates a phase deviation between incremental signals and an index signal, and between incremental signals by selecting proper switches in cascaded resistor strings.

BACKGROUND OF THE DISCLOSURE

Referring to FIG. 1, it is a block diagram of a conventional optical encoder that includes a light source 11, an encoding medium 13, photodiodes 15, a trans-impedance amplifier (TIA) 17 and a comparator 19. The photodiodes 15 detect light emitted from the light source 11 and modulated by the encoding medium 13 to output four signals A, B, A' and B' sequentially having a 90-degree phase shift via the TIA 17. The comparator 19 compares the four signals A, B, A' and B' to output two output signals CHA and CHB.

FIG. 2 is a timing diagram of the two output signals CHA and CHB. It is seen from FIG. 2 that voltage levels of the two output signals CHA and CHB have a combination of four states within one period of the encoding medium 13. Accordingly, four positions of the encoding medium 13 can be indicated.

In a 3-channel incremental optical encoder, a third signal called index signal is generated from the second track in a code wheel. The index signal is used as a homing signal in a motor feedback system. However, if components of the 3-channel incremental optical encoder have a spatial deviation therebetween, the index signal can have a phase deviation from incremental AB signals, i.e. CHA and CHB as shown in FIG. 2.

FIG. 3A shows a signal timing diagram of incremental AB signals and index signals at a normal spatial arrangement. FIG. 3B shows a signal timing diagram of the incremental AB signals and the index signals, in which an index slit for generating the index signals has a positive spatial deviation. FIG. 3C shows a signal timing diagram of the incremental AB signals and the index signals, in which an index slit for generating the index signals has a negative spatial deviation. It is seen from FIGS. 3B and 3C that two peaks appear in the index signals, and the two peaks will affect the determining of absolute positions.

Furthermore, due to the system imperfection, the CHA and CHB may not have a phase offset of exactly 90 degrees.

SUMMARY

Accordingly, the present disclosure provides a phase shifter circuit of an incremental optical encoder that calibrates a phase deviation between incremental signals and an index signal, and between the incremental signals by selecting proper switches in resistor strings.

The present disclosure provides a phase shifter circuit of an optical encoder including a first resistor string, a second resistor string, a third resistor string, a fourth resistor string, 4×(M+1) tape-out nodes, a first amplifier and a second amplifier. The phase shifter circuit receives a first signal, a second signal, a third signal and a fourth signal sequentially having a 90-degree phase shift. The first resistor string has M identical first resistors cascaded together, and two ends of the first resistor string receive the first signal and the fourth signal, respectively. The second resistor string has M identical second resistors cascaded together, and two ends of the second resistor string receive the third signal and the second signal, respectively. The third resistor string has M identical third resistors cascaded together, and two ends of the third resistor string receive the second signal and the first signal, respectively. The fourth resistor string has M identical fourth resistors cascaded together, and two ends of the fourth resistor string receive the fourth signal and the third signal, respectively. The 4×(M+1) tape-out nodes are respectively located at one end of each of the M first resistors, the M second resistors, the M third resistors and the M fourth resistors. The first amplifier has two inputs respectively coupled to (M+1) tape-out nodes of the first resistor string and the second resistor string. The second amplifier has two inputs respectively coupled to (M+1) tape-out nodes of the third resistor string and the fourth resistor string.

The present disclosure further provides a phase shifter circuit of an optical encoder including a first resistor string, a second resistor string, a third resistor string, a fourth resistor string, 4×(M+1) tape-out nodes, 4×M×N tape-out sub-nodes, a first amplifier and a second amplifier. The phase shifter circuit receives a first signal, a second signal, a third signal and a fourth signal sequentially having a 90-degree phase shift. The first resistor string has M identical first resistors cascaded together, and two ends of the first resistor string receive the first signal and the fourth signal, respectively. The second resistor string has M identical second resistors cascaded together, and two ends of the second resistor string receive the third signal and the second signal, respectively. The third resistor string has M identical third resistors cascaded together, and two ends of the third resistor string receive the second signal and the first signal, respectively. The fourth resistor string has M identical fourth resistors cascaded together, and two ends of the fourth resistor string receive the fourth signal and the third signal, respectively. The 4×(M+1) tape-out nodes are respectively located at one end of each of the M first resistors, the M second resistors, the M third resistors and the M fourth resistors. The 4×M×N tape-out sub-nodes are respectively located within each of the M first resistors, the M second resistors, the M third resistors and the M fourth resistors. The first amplifier has two inputs respectively coupled to (M+1) tape-out nodes or coupled to M×N tape-out sub-nodes of the first resistor string and the second resistor string. The second amplifier has two inputs respectively coupled to (M+1) tape-out nodes or coupled to M×N tape-out sub-nodes of the third resistor string and the fourth resistor string.

The present disclosure provides an operating method of a phase shifter circuit of an optical encoder. The phase shifter circuit receives a first signal, a second signal, a third signal and a fourth signal sequentially having a 90-degree phase shift. The operating methods includes the steps of: generating a first incremental signal and a second incremental signal according to the first, second, third and fourth signals; checking a second phase shift between the first incremental signal and the second incremental signal; selecting a first sub-switching device among M×N sub-switching devices of the first and second resistor strings or selecting a second sub-switching device among M×N sub-switching devices of the third and fourth resistor strings to compensate the second phase shift; checking a first phase shift between the first and second incremental signals and an index signal; and conducting a first switching device among (M+1) switching devices of the third and fourth resistor strings to compensate the first phase shift and the first sub-switching device associated with the first switching device, or conducting a second switching device among (M+1) switching devices of the first and second resistor strings to compensate the first phase shift and the second sub-switching device associated with the second switching device.

BRIEF DESCRIPTION OF DRAWINGS

Other objects, advantages, and novel features of the present disclosure will become more apparent from the following detailed description when taken in conjunction with the accompanying drawings.

FIG. 4 is a schematic diagram of an incremental optical encoder according to one embodiment of the present disclosure.

DETAILED DESCRIPTION OF THE DISCLOSURE

It should be noted that, wherever possible, the same reference numbers will be used throughout the drawings to refer to the same or like parts.

One objective of the present disclosure is to provide a phase shifter circuit of an optical encoder for correcting a first phase shift between incremental signals (e.g., CHA and CHB mentioned above) and an index signal and a second phase shift between the incremental signal CHA and the incremental signal CHB. The phase shifter circuit further has the ability to change a gain of amplifiers connected behind phase-delay resistor strings to compensate an attenuation of tape-out signals from the phase-delay resistor strings.

Please refer to FIG. 4, it is a schematic diagram of an incremental optical encoder 400 according to one embodiment of the present disclosure. The incremental optical encoder 400 is shown as a reflective type optical encoder as an example, but the present disclosure is not limited thereto. The phase shifter circuit of the present disclosure is also adaptable to a transmissive type optical encoder.

Figure 1:
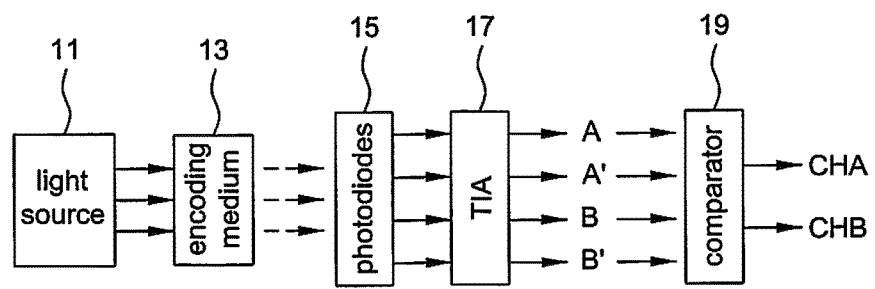
FIG. 1 is a block diagram of a conventional optical encoder.
Figure 2:
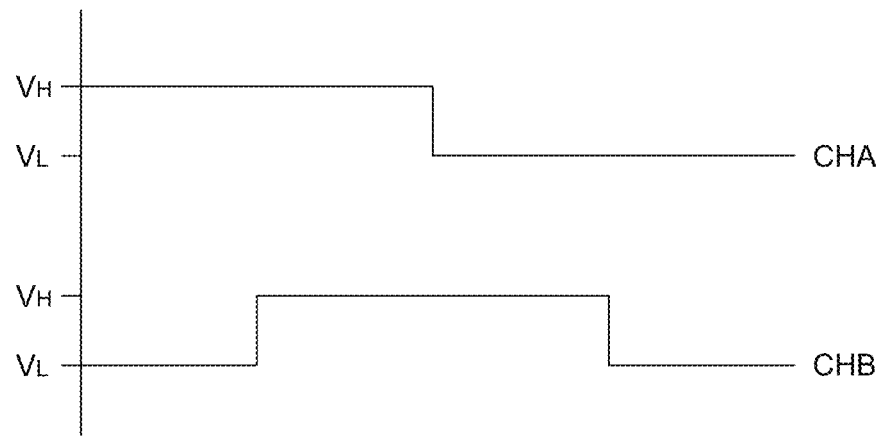
FIG. 2 is a timing diagram of output signals of the optical encoder in FIG. 1.

The incremental optical encoder 400 includes an encoding medium 41, a light source 41 and photodiodes 43. The light source 41 is a light emitting diode or a laser diode. The encoding medium 41 is arranged (e.g., attached, sputtered or painted, but not limited to) with an incremental track and an index slit. The incremental track is used to generate a first incremental signal (e.g., CHA) and a second incremental signal (e.g., CHB), e.g., referring to FIG. 2. The index slit is used to generate an index signal, e.g., shown as Index in FIGS. 7-9 below.

Figure 5:
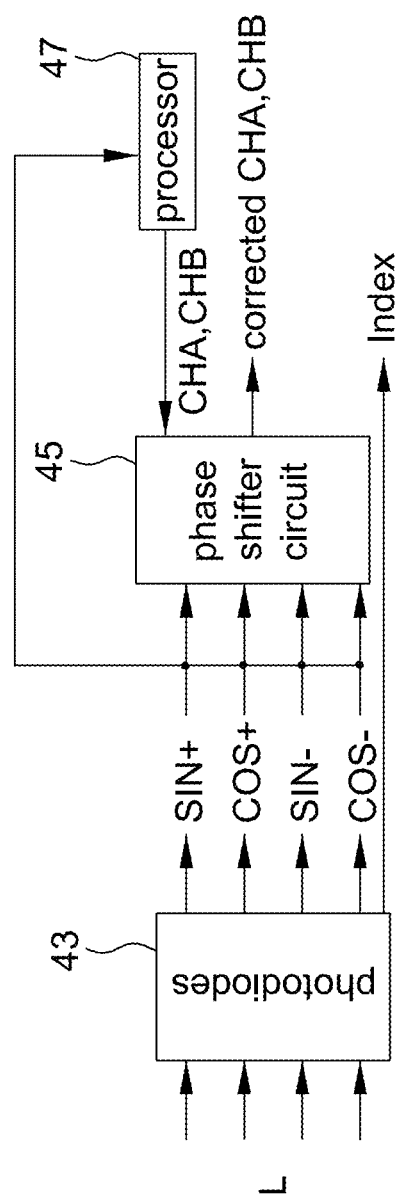
FIG. 5 is a schematic diagram of an operation of a phase shifter circuit according to one embodiment of the present disclosure.

Please refer to FIG. 5, it is a schematic diagram of an operation of a phase shifter circuit 45 according to one embodiment of the present disclosure. The phase shifter circuit 45 is used to receive a first signal (e.g., shown as SIN+), a second signal (e.g., shown as COS+), a third signal (e.g., shown as SIN−) and a fourth signal (e.g., shown as COS−) sequentially having a 90-degree phase shift. In one aspect, the phase shifter circuit 45 includes a comparator to generate CHA and CHB according to the first, second, third and fourth signals. In another aspect the phase shifter circuit 45 receives the CHA and CHB from a processor 47, e.g., a micro controller unit (MCU), an application specific integrated circuit (ASIC) or a field programmable gate array (FPGA), but not limited to.

The phase shifter circuit 45 is further used to output phase-corrected (if required) CHA and CHB to remove a first phase shift between CHAB and Index, and a second phase shift between CHA and CHB, details of one example are described below.

Figure 3A:
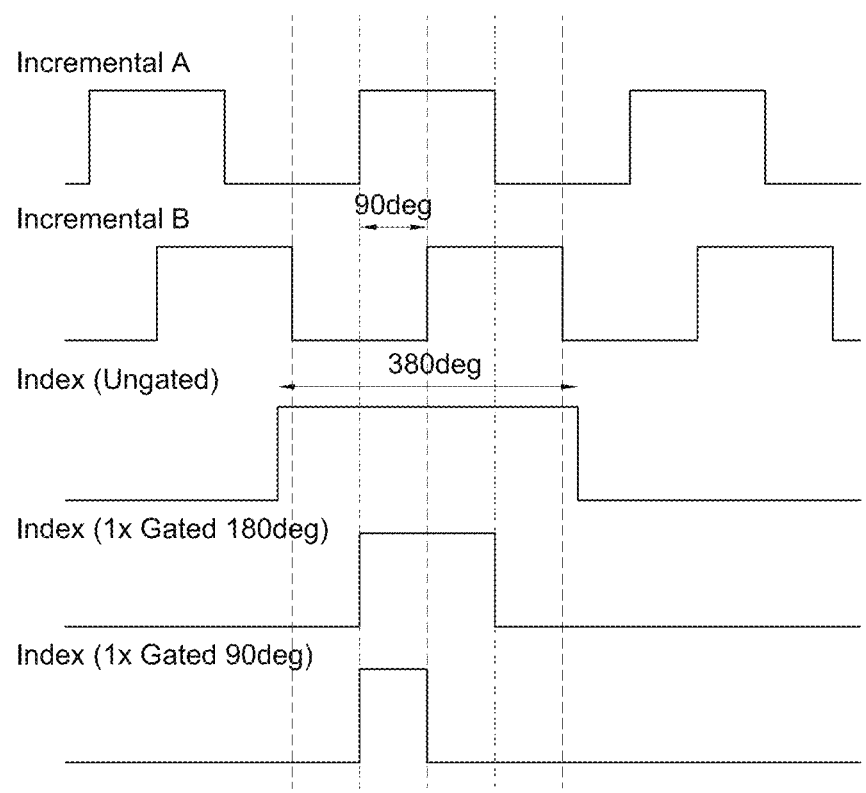
FIG. 3A is a timing diagram of incremental AB signals and index signals at a normal spatial arrangement.
Figure 3B:
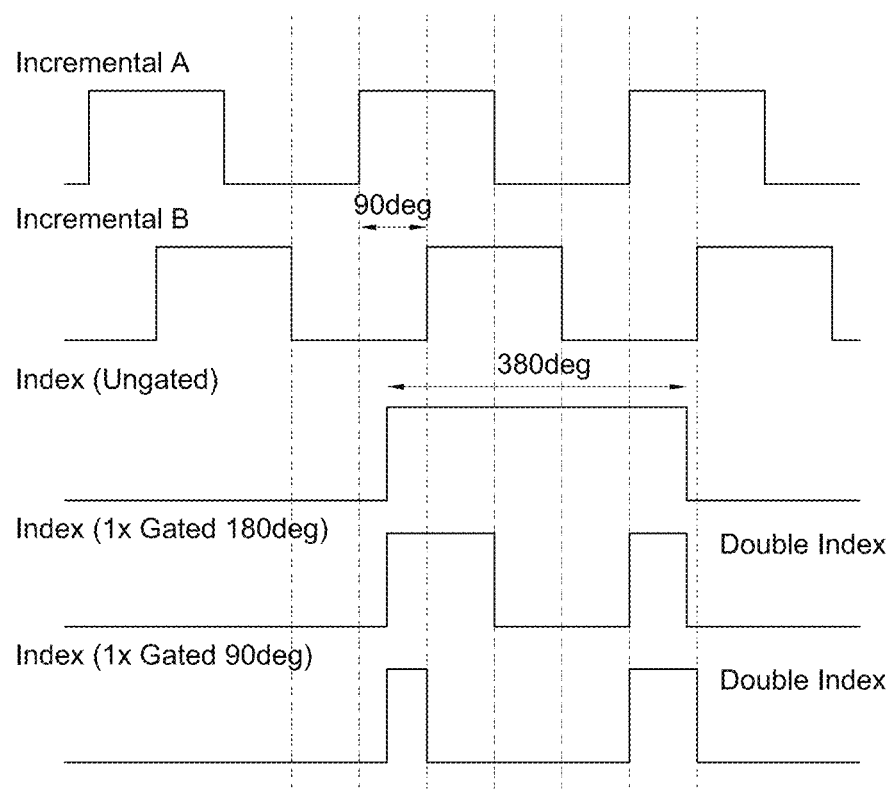
FIG. 3B is a timing diagram of the incremental AB signals and the index signals in which an index slit has a positive position deviation in a tangential direction of an encoding medium.
Figure 3C:
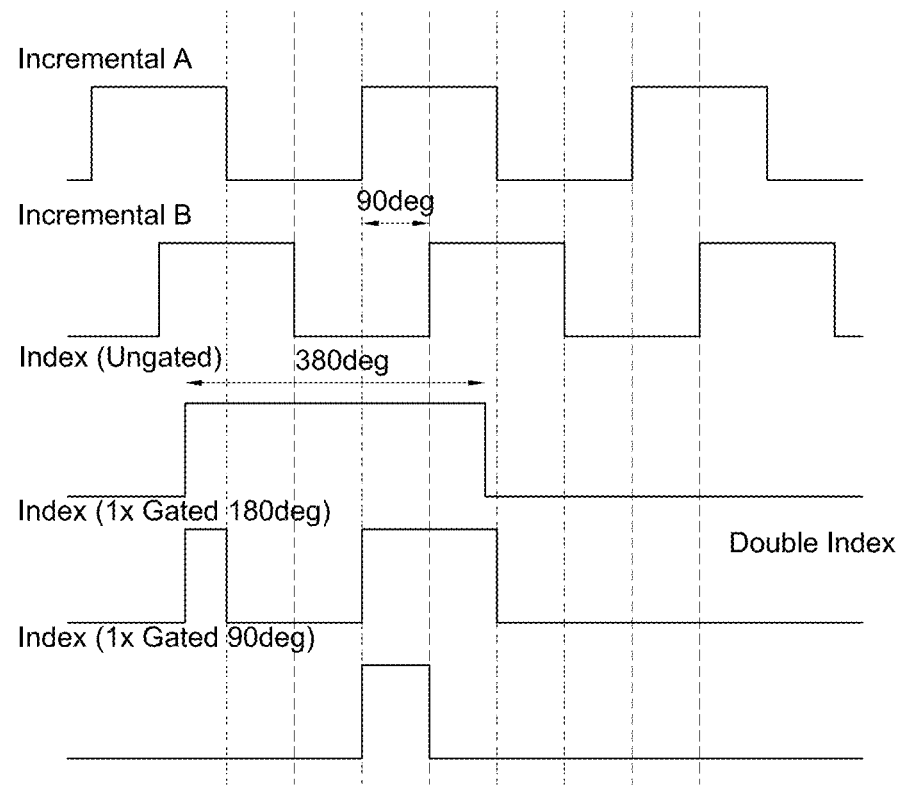
FIG. 3C is a timing diagram of the incremental AB signals and the index signals in which an index slit has a negative position deviation in a tangential direction of an encoding medium.

Details of the photodiodes 43 to generate the first, second third and fourth signals are known to the art, and thus are not described herein. Details of generating CHA and CHB according to the first, second third and fourth signals are known to the art, e.g., by comparing amplitudes between SIN+ and COS− and between SIN+ and COS+, but not limited to, and thus are not described herein. The objective of the present disclosure is to correct a phase deviation when CHA and CHB do not have exactly 90-degree phase shift and when CHAB are not aligned with the index signal to cause double indexes as shown in FIGS. 3B and 3C.

Figure 6:
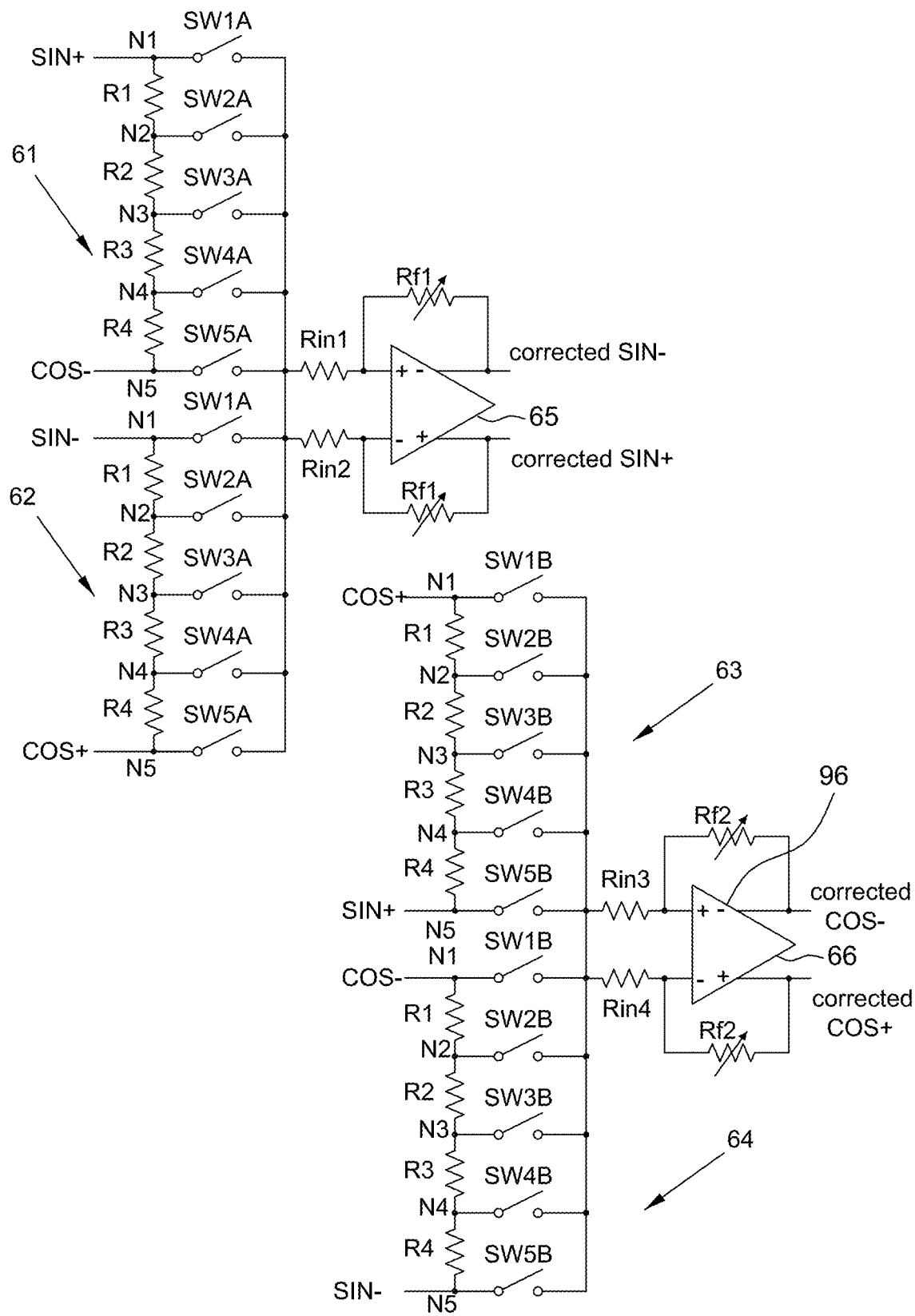
FIG. 6 is a circuit diagram of a phase shifter circuit according to one embodiment of the present disclosure.

Please refer to FIG. 6, it is a circuit diagram of a phase shifter circuit 600 according to one embodiment of the present disclosure. The phase shifter circuit 600 includes a first resistor string 61, a second resistor string 62, a third resistor string 63, a fourth resistor string 64, a first amplifier 65 and a second amplifier 66.

The first resistor string 61 has M (e.g., M=4 as an example) identical first resistors (e.g., shown as R1, R2, R3 and R4) cascaded together, and two ends of the first resistor string 61 are used to receive the first signal SIN+ and the fourth signal COS−, respectively. The second resistor string 62 has M identical second resistors (e.g., shown as R1, R2, R3 and R4) cascaded together, and two ends of the second resistor string 62 are used to receive the third signal SIN− and the second signal COS+, respectively. The third resistor string 63 has M identical third resistors (e.g., shown as R1, R2, R3 and R4) cascaded together, and two ends of the third resistor string 63 are used to receive the second signal COS+ and the first signal SIN+, respectively. The fourth resistor string 64 has M identical fourth resistors (e.g., shown as R1, R2, R3 and R4) cascaded together, and two ends of the fourth resistor string 64 are used to receive the fourth signal COS− and the third signal SIN−, respectively.

In the present disclosure, R1, R2, R3 and R4 have identical resistance, and different symbols are to indicate resistors at different positions of a resistor string.

One method to determine R1, R2, R3 and R4 is using an equation (1): Rs,k=Rs_total/(1+tan θk), wherein Rs,k is an accumulated resistance in Table I, θk is a delay angle (or phase) in Table I. In Table I, Rs_total=100000Ω as an example.

TABLE I

| Delay Angle θk | Accumulated Resistance | Resistance |
|---|---|---|
| 0 | 10000 | |
| 22.5 | 7071.1 | R1 = 10000 − 7071.1 = 2928.9Ω |
| 45 | 5000 | R2 = 7071.1 − 5000 = 2071.1Ω |
| 67.5 | 2928.9 | R3 = 5000 − 2928.9 = 2071.1Ω |
| 90 | 0 | R4 = 2928.9 − 0 = 2928.9Ω |

It is seen from FIG. 6 that each of the first resistor string 61, the second resistor string 62, the third resistor string 63 and the fourth string 64 respectively includes (M+1) tap-out nodes (e.g., shown as N1, N2, N3, N4 and N5) located at one end of R1, R2, R3 and R4. Each resistor is connected between two tap-out nodes. A total number of 4×(M+1) tape-out nodes are included in the phase shifter circuit 600.

The first amplifier 65 has two inputs (i.e. a non-inverted input and an inverted input) respectively coupled to the (M+1) tape-out nodes of the first resistor string 61 and the second resistor string 62. The second amplifier 66 has two inputs (i.e. a non-inverted input and an inverted input) respectively coupled to (M+1) tape-out nodes of the third resistor string 63 and the fourth resistor string 64.

Referring to FIG. 6 again, the phase shifter circuit 600 further includes a first input resistor Rin1, a second input resistor Rin2, two first feedback resistors Rf1, a third input resistor Rin3, a fourth input resistor Rin4 and two second feedback resistors Rf2. The first input resistor Rin1 is coupled between a non-inverted input of the first amplifier 65 and the first resistor string 61. The second input resistor Rin2 is coupled between an inverted input of the first amplifier 65 and the second resistor string 62. The two first feedback resistors Rf1 are respectively coupled between the non-inverted input and an inverted output of the first amplifier 65 and between the inverted input and a non-inverted output of the first amplifier 65. The first amplifier 65 is used to output a phase-corrected SIN− and a phase-corrected SIN+.

The third input resistor Rin3 is coupled between a non-inverted input of the second amplifier 66 and the third resistor string 63. The fourth input resistor Rin4 is coupled between an inverted input of the second amplifier 66 and the fourth resistor string 64. The two second feedback resistors Rf2 are respectively coupled between the non-inverted input and an inverted output of the second amplifier 66 and between the inverted input and a non-inverted output of the second amplifier 66. The second amplifier 66 is used to output a phase-corrected COS− and a phase-corrected COS+.

Each of the first resistor string 61, the second resistor string 62, the third resistor string 63 and the fourth string 64 further includes (M+1) switching devices (e.g., a transistor switch device, but not limited to), shown as SW1A to SW5A and SW1B to SW5B, connected to the (M+1) tap-out nodes to couple the first amplifier 65 to one tape-out node of the first resistor string 61 and the second resistor string 62, and couple the second amplifier 66 to one tape-out node of the third resistor string 63 and the fourth resistor string 64.

FIG. 6 shows that a switching device SW1A is coupled between a tap-out node N1 (in the first and second resistor strings) and the first amplifier 65; a switching device SW2A is coupled between a tap-out node N2 (in the first and second resistor strings) and the first amplifier 65; a switching device SW3A is coupled between a tap-out node N3 (in the first and second resistor strings) and the first amplifier 65; a switching device SW4A is coupled between a tap-out node N4 (in the first and second resistor strings) and the first amplifier 65; and a switching device SW5A is coupled between a tap-out node N5 (in the first and second resistor strings) and the first amplifier 65.

FIG. 6 also shows that a switching device SW1B is coupled between a tap-out node N1 (in the third and fourth resistor strings) and the second amplifier 66; a switching device SW2B is coupled between a tap-out node N2 (in the third and fourth resistor strings) and the second amplifier 66; a switching device SW3B is coupled between a tap-out node N3 (in the third and fourth resistor strings) and the second amplifier 66; a switching device SW4B is coupled between a tap-out node N4 (in the third and fourth resistor strings) and the second amplifier 66; and a switching device SW5B is coupled between a tap-out node N5 (in the third and fourth resistor strings) and the second amplifier 66.

In FIG. 6, when the switching devices SW1A are conducted, tape-out signals (i.e. phase-corrected signals) from the first resistor string 61 and the second resistor string 62 have no phase delay; when the switching devices SW2A are conducted, tape-out signals from the first resistor string 61 and the second resistor string 62 have 22.5° phase delay; when the switching devices SW3A are conducted, tape-out signals from the first resistor string 61 and the second resistor string 62 have 45° phase delay; when the switching devices SW4A are conducted, tape-out signals from the first resistor string 61 and the second resistor string 62 have 67.5° phase delay; and when the switching devices SW5A are conducted, tape-out signals from the first resistor string 61 and the second resistor string 62 have 90° phase delay.

Similarly, when the switching devices SW1B are conducted, tape-out signals (i.e. phase-corrected signals) from the third resistor string 63 and the fourth resistor string 64 have no phase delay; when the switching devices SW2B are conducted, tape-out signals from the third resistor string 63 and the fourth resistor string 64 have 22.5° phase delay; when the switching devices SW3B are conducted, tape-out signals from the third resistor string 63 and the fourth resistor string 64 have 45° phase delay; when the switching devices SW4B are conducted, tape-out signals from the third resistor string 63 and the fourth resistor string 64 have 67.5° phase delay; and when the switching devices SW5B are conducted, tape-out signals from the third resistor string 63 and the fourth resistor string 64 have 90° phase delay.

In one aspect, when the first signal SIN+, the second signal COS+, the third signal SIN− and the fourth signal COS− have a first phase shift from an index signal, the first amplifier 65 is coupled to a first tape-out node of the first resistor string 61 and a second tape-out node of the second resistor string 62, the second amplifier 66 is coupled to a third tape-out node of the third resistor string 63 and a fourth tape-out node of the fourth resistor string 64, and the first tape-out node, the second tape-out node, the third tape-out node and the fourth tape-out node are at a corresponding position of the first resistor string 61, the second resistor string 62, the third resistor string 63 and the fourth resistor string 64 to compensate the first phase shift, i.e. SW1A and SW1B conducted together, SW2A and SW2B conducted together, SW3A and SW3B conducted together, SW4A and SW4B conducted together, SW5A and SW5B conducted together.

Figure 7:
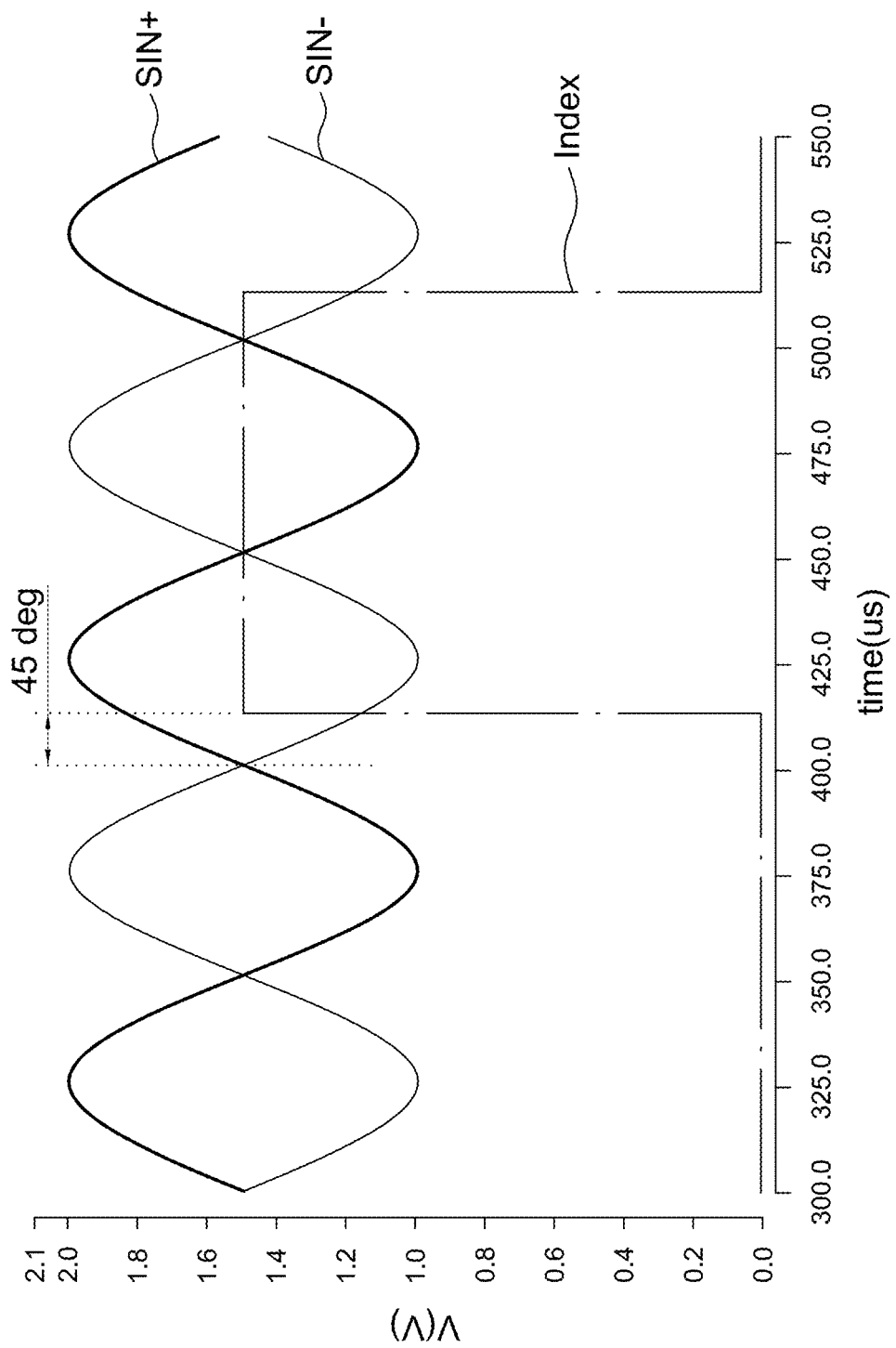
FIG. 7 is a schematic diagram of a first phase shift between an Index and sine wave signals.

For example, FIG. 7 shows that the first signal SIN+ and the third signal SIN− lead the index signal (shown as Index) by a phase of 45 degrees (i.e. the first phase shift=45°), and it is assumed that the second signal COS+ and the fourth signal COS− also lead the Index by a phase of 45 degrees. To correct the first phase shift, the first amplifier 65 is coupled to a tape-out node N3 (i.e. the first tape-out node) of the first resistor string 61 and coupled to a tape-out node N3 (i.e. the second tape-out node) of the second resistor string 62; and the second amplifier 66 is coupled to a tape-out node N3 (i.e. the third tape-out node) of the third resistor string 63 and coupled to a tape-out node N3 (i.e. the fourth tape-out node) of the fourth resistor string 64. In this aspect, since there is the first phase shift, the first tape-out node, the second tape-out node, the third tape-out node and the fourth tape-out node are not at a tape-out node having no phase delay, i.e. not at N1.

After the phase correction, the phase-corrected first signal SIN+_pc and the phase-corrected third signal SIN−_pc no longer have the first phase shift from the Index, wherein SIN+_pc and SIN−_pc are referred to tape-out signals herein. However, because the phase-corrected first signal SIN+_pc and the phase-corrected third signal SIN−_pc go through the resistor R1 and R2, they are attenuated by 0.707 times, e.g., calculated by ((R3+R4)/Rs_total)/cos (45°) from the first signal SIN+ and the third signal SIN−, referring to FIG. 8. The attenuation of 22.5° phase shift is calculated by ((R2+R3+R4)/Rs_total)/) cos (22.5°), and the attenuation of 67.5° phase shift is calculated by ((R4)/Rs_total)/) cos (67.5°).

To compensate the amplitude attenuation, the first feedback resistor Rf1 and the second feedback resistor Rf2 are adjustable so as to change a gain thereof to compensate (i.e. amplify) tap-out signals attenuated by the first resistor string 61, the second resistor string 62, the third resistor string 63 and the fourth resistor strings 64. In the 45° phase shift case, Rf1/Rin1 and Rf1/Rin2 is set about 1.41 to cause amplitudes of the phase-corrected and amplified first signal SIN+_pc_amp and the phase-corrected and amplified third signal SIN−_pc_amp outputted from the first amplifier 65 and the second amplifier 66 are respectively identical to amplitudes of the first signal SIN+ and the third signal SIN−, e.g., shown in FIG. 9.

Figure 8:
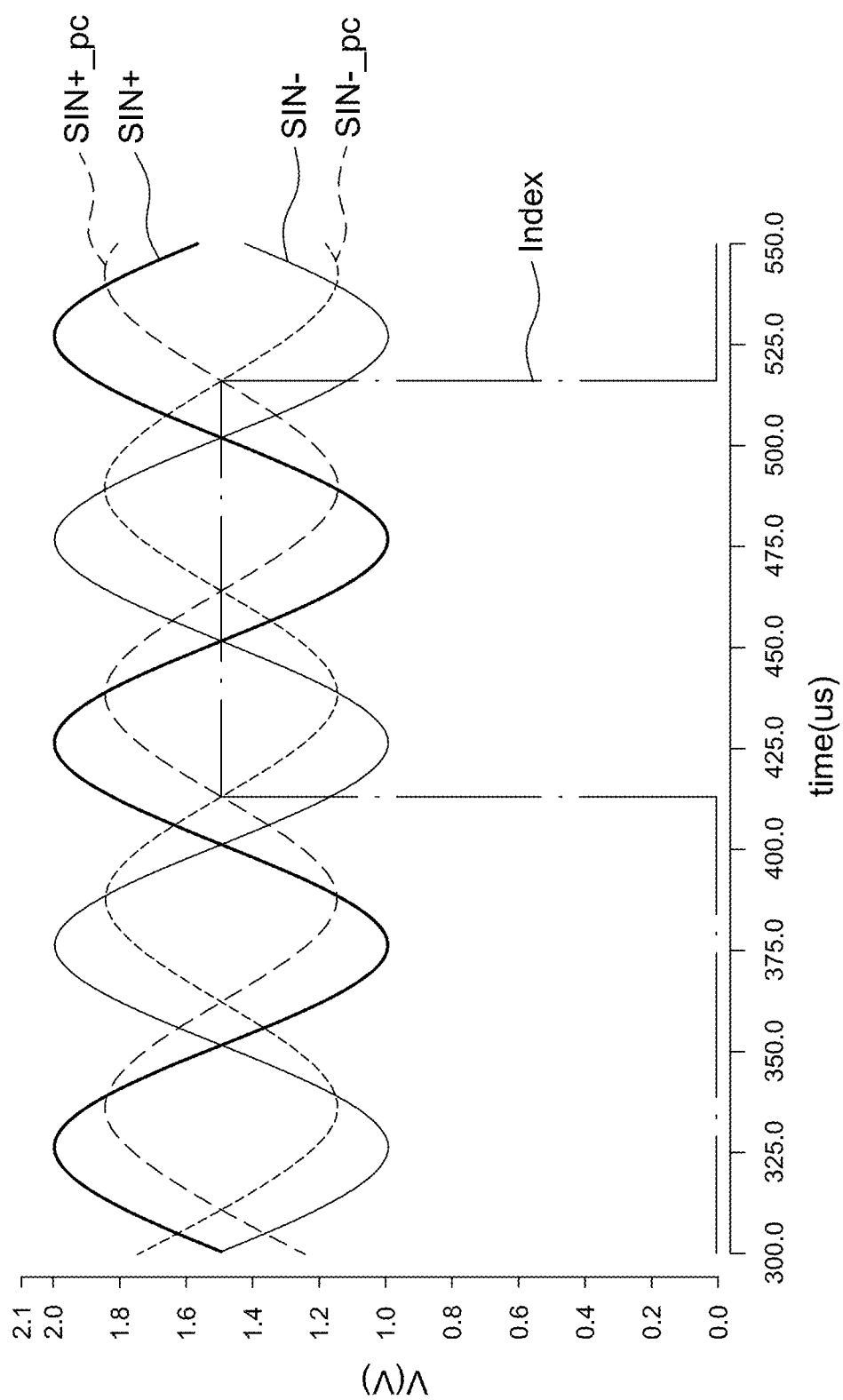
FIG. 8 is a schematic diagram of an attenuation of phase-corrected sine wave signals.
Figure 9:
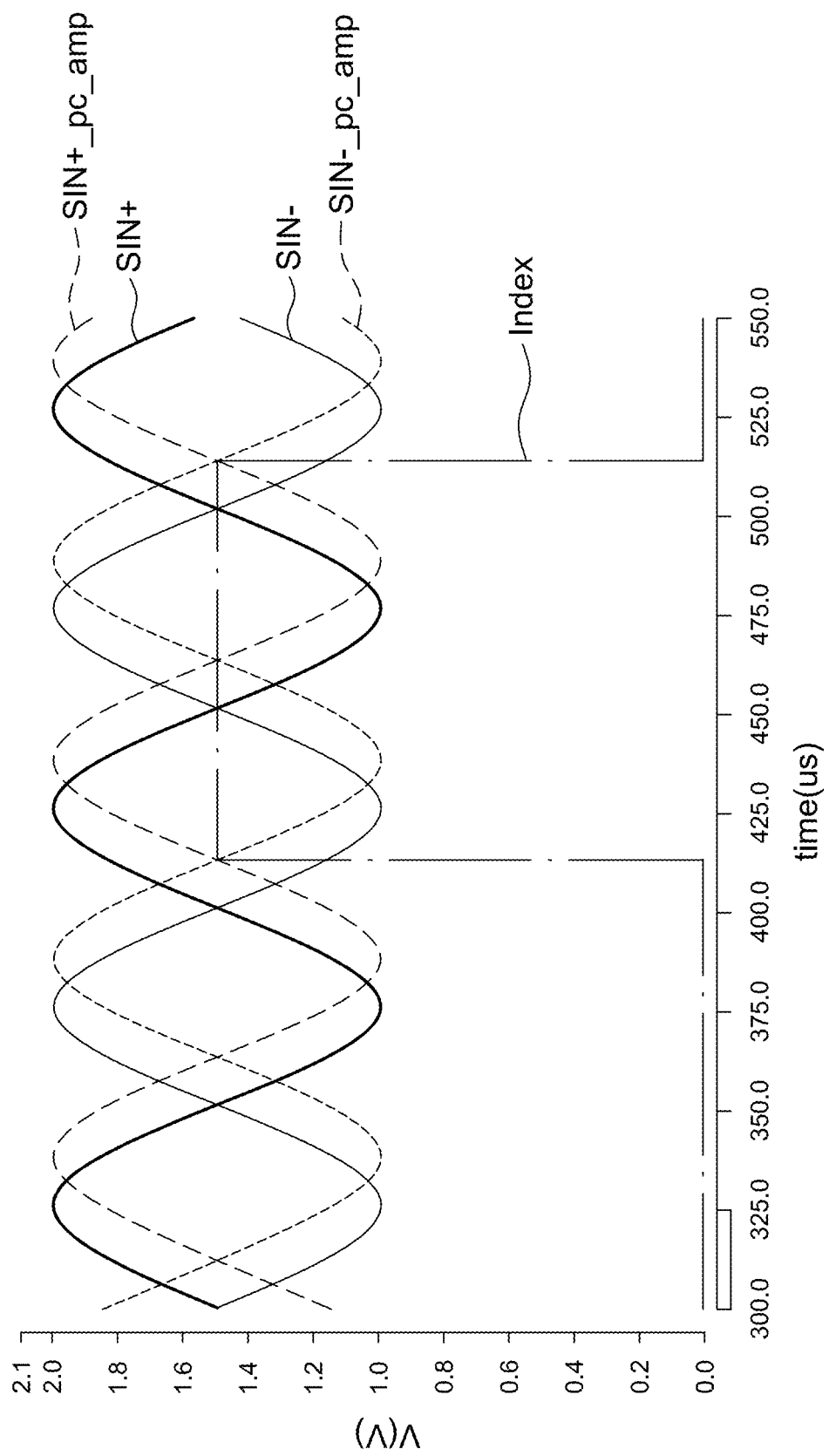
FIG. 9 is a schematic diagram of compensating the attenuation of phase-corrected sine wave signals shown in FIG. 8.

The phase correction and the amplification of the second signal COS+ and the fourth signal COS− are similar to those of the first signal SIN+ and the third signal SIN− as shown in FIGS. 7-9, and thus details thereof are not repeated herein. COS+ and COS− are also referred to tape-out signals herein. Therefore, in the 45° phase shift case, Rf2/Rin3 and Rf2/Rin4 is set about 1.41.

By the way, in the 22.5° and 67.5° phase shift cases, Rf1/Rin1, Rf1/Rin2, Rf2/Rin3 and Rf2/Rin4 are set as 1.31.

It should be mentioned that values of Rf1/Rin1, Rf1/Rin2, Rf2/Rin3 and Rf2/Rin4 of the phase shifter circuit 600 are not limited to those mentioned in the present disclosure as long as amplitudes of the attenuated tape-out signals are amplified to be substantially identical to amplitudes of the first signal SIN+, the second signal COS+, the third signal SIN− and the fourth signal COS−.

In another aspect, when the first signal SIN+ and the third signal SIN− have a second phase shift from the second signal COS+ and the fourth signal COS−, the first amplifier 65 is coupled to a first tape-out node of the first resistor string 61 and a second tape-out node of the second resistor string 62, the second amplifier 66 is coupled to a third tape-out node of the third resistor string 63 and a fourth tape-out node of the fourth resistor string 64, and the first tape-out node and the second tape-out node are at a first corresponding position of the first resistor string 61 and the second resistor string 62, and the third tape-out node and the fourth tape-out node are at a second corresponding position, different from the first corresponding first position, of the third resistor string 63 and the fourth resistor string 64 to compensate the second phase shift.

Figure 10:
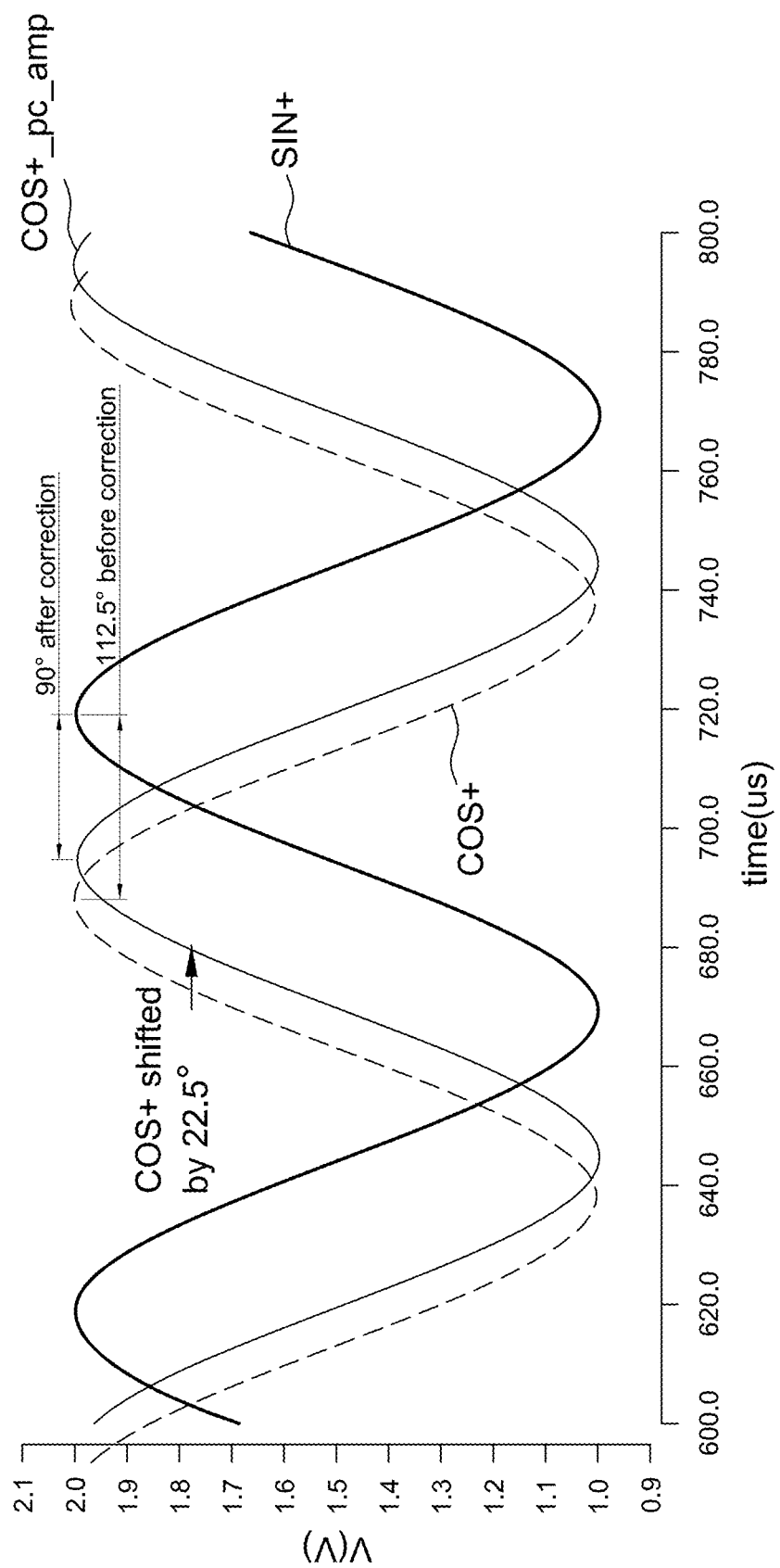
FIG. 10 is a schematic diagram of a second phase shift between two incremental signals.

For example, FIG. 10 shows that the first signal SIN+ lags the second signal COS+ by a phase of 112.5 degrees (i.e. the second phase shift=22.5°), and it is assumed that the third signal SIN− also lags the fourth signal COS− by a phase of 112.5 degrees. To correct the second phase shift, the first amplifier 65 is coupled to a tape-out node N1 (i.e. the first tape-out node) of the first resistor string 61 and a tape-out node N1 (i.e. the second tape-out node) of the second resistor string 62; and the second amplifier 66 is coupled to a tape-out node N2 (i.e. the third tape-out node) of the third resistor string 63 and a tape-out node N2 (i.e. the fourth tape-out node) of the fourth resistor string 64.

In this aspect, if there is a second phase shift, the first tape-out node and the second tape-out node are at tape-out nodes having no phase delay, but the third tape-out node and the fourth tape-out node are at tape-out nodes having a phase shifting to compensate the second phase shift (e.g., the case shown in 10). Or, the third tape-out node and the fourth tape-out node are at tape-out nodes having no phase delay, but the first tape-out node and the second tape-out node are at tape-out nodes having a phase shifting to compensate the second phase shift. Although FIG. 10 shows that the second signal COS+ is corrected by 22.5 degrees to match a 90-degree phase difference from the first signal SIN+, the present disclosure is not limited thereto. In the case that the first signal SIN+ lags the second signal COS+ by a phase difference smaller than 90 degrees, the first signal SIN+ is corrected, e.g., the third tape-out node and the fourth tape-out node at tape-out nodes having no phase delay but the first tape-out node and the second tape-out node at tape-out nodes having a phase shifting. It is also possible to correct all of the first signal SIN+, the second signal COS+, the third signal SIN− and the fourth signal COS− to correct the second phase shift.

The method of correcting the third signal SIN− and the fourth signal COS− is similar to that of correcting the first signal SIN+ and the second signal COS+ shown in FIG. 10, and thus details thereof are not repeated herein. In FIG. 10, COS+ and COS− are phase-corrected but SIN+ and SIN− are not phase-corrected.

Similarly, the tape-out signals, e.g., COS+ and COS− in the FIG. 10 case, are attenuated by the resistor string, referring to FIG. 8, one of the first feedback resistor Rf1 and the second feedback resistor Rf2 (e.g., Rf2 in the FIG. 10 case) is adjusted to change a gain thereof to compensate tap-out signals attenuated by of the first and second resistor strings or by the third and fourth resistor strings (e.g., the third and fourth resistor strings in the FIG. 10 case). In the aspect that all of the first, second, third and fourth signals are phase-corrected to remove the second phase shift, both the first feedback resistor Rf1 and the second feedback resistor Rf2 are adjusted to change a gain thereof. FIG. 10 shows that the phase-corrected and amplifier second signal COS+_pc_amp has an amplitude identical to the first signal SIN+.

Figure 11:
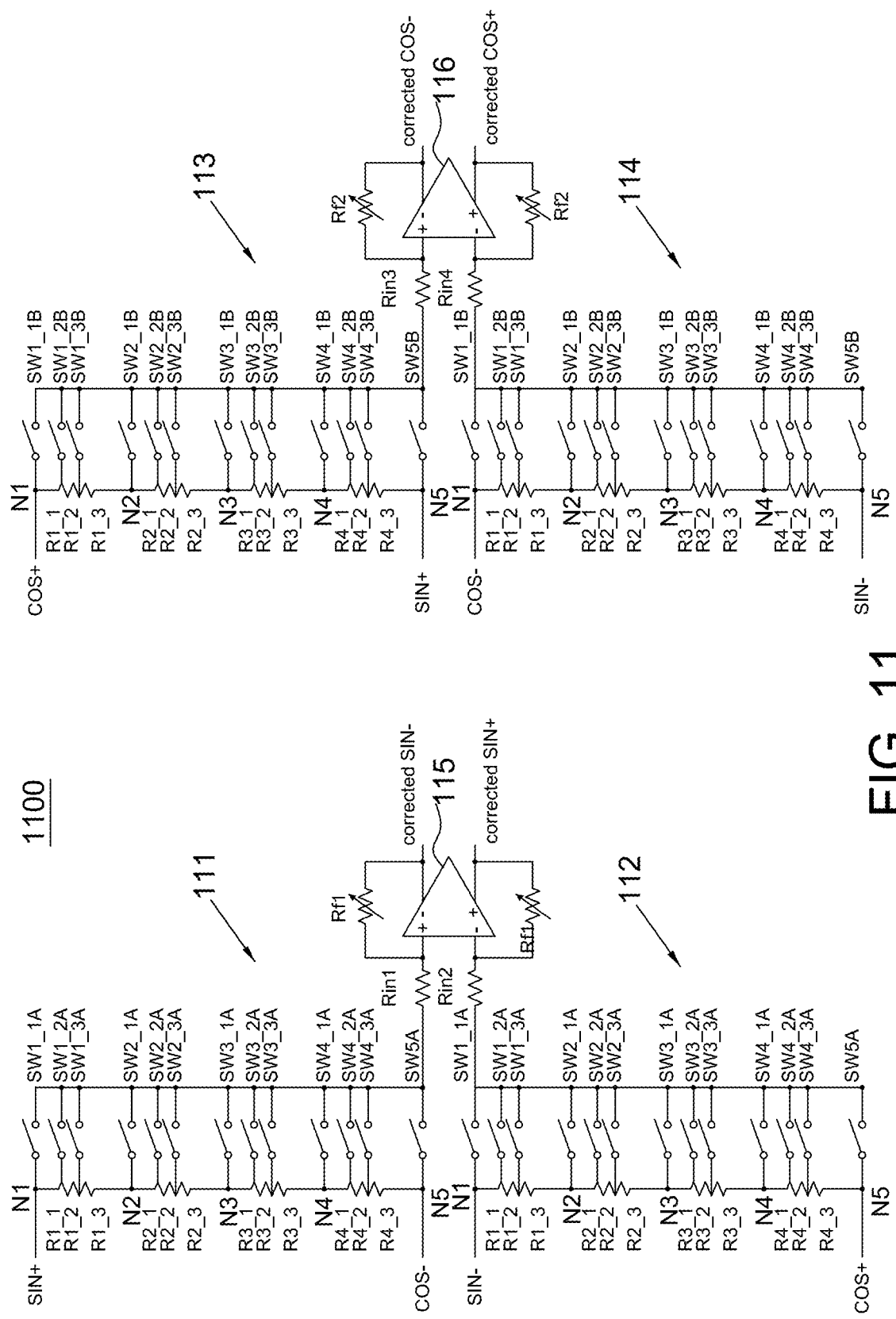
FIG. 11 is a circuit diagram of a phase shifter circuit according to another embodiment of the present disclosure.

Please refer FIG. 11, it is a circuit diagram of a phase shifter circuit 1100 according to another embodiment of the present disclosure. In addition to 4×(M+1) tape-out nodes (e.g., N1, N2, N3, N4 and N5) as shown in FIG. 6, the phase shifter circuit 1100 further includes 4×M×N tape-out sub-nodes, respectively located within each of the M first resistors, the M second resistors, the M third resistors and the M fourth resistors; and 4×M×N sub-switching devices coupled between the 4×M×N tape-out sub-nodes and the first amplifier 115 and the second amplifier 116, wherein N is a number to divide each of the M first resistors, the M second resistors, the M third resistors and the M fourth resistors to (N+1) resistor sections, e.g., N=2 in FIG. 11. A number of N is determined according to the minimum phase to be shifted.

FIG. 11 shows that switching devices SW1_1A, SW2_1A, SW3_1A, SW4_1A and SW5_1A are connected between tape-out nodes N1 to N5 of the first and second resistor strings and the first amplifier 115, and switching devices SW1_1B, SW2_1B, SW3_1B, SW4_1B and SW5_1B are connected between tape-out nodes N1 to N5 of the third and fourth resistor strings and the second amplifier 116.

FIG. 11 also shows that sub-switching devices SW1_2A and SW1_3A are connected to tape-out sub-nodes within R1 of the first and second resistor strings to divide R1 into three resistor sections R1_1, R1_2 and R1_3; sub-switching devices SW2_2A and SW2_3A are connected to tape-out sub-nodes within R2 of the first and second resistor strings to divide R2 into three resistor sections R2_1, R2_2 and R2_3; sub-switching devices SW3_2A and SW3_3A are connected to tape-out sub-nodes within R3 of the first and second resistor strings to divide R3 into three resistor sections R3_1, R3_2 and R3_3; and sub-switching devices SW4_2A and SW4_3A are connected to tape-out sub-nodes within R4 of the first and second resistor strings to divide R4 into three resistor sections R4_1, R4_2 and R4_3.

Similarly, sub-switching devices SW1_2B and SW1_3B are connected to tape-out sub-nodes within R1 of the third and fourth resistor strings to divide R1 into three resistor sections R1_1, R1_2 and R1_3; sub-switching devices SW2_2B and SW2_3B are connected to tape-out sub-nodes within R2 of the third and fourth resistor strings to divide R2 into three resistor sections R2_1, R2_2 and R2_3; sub-switching devices SW3_2B and SW3_3B are connected to tape-out sub-nodes within R3 of the third and fourth resistor strings to divide R3 into three resistor sections R3_1, R3_2 and R3_3; and sub-switching devices SW4_2B and SW4_3B are connected to tape-out sub-nodes within R4 of the third and fourth resistor strings to divide R4 into three resistor sections R4_1, R4_2 and R4_3.

It is considered that a second phase shift between the first incremental signal CHA and the second incremental signal CHB is generally smaller than a first phase shift between incremental signals CHAB and an index signal, the sub-switching devices herein are used to correct the second phase shift, and the switching devices herein are used to correct the first phase shift. By arranging both the switching devices and the sub-switching devices, both the first and second phase shifts are corrected.

The first amplifier 115 has two inputs respectively coupled to the (M+1) tape-out nodes or to the M×N tape-out sub-nodes of the first resistor string 111 and the second resistor string 112. The second amplifier 116 has two inputs respectively coupled to the (M+1) tape-out nodes or to the M×N tape-out sub-nodes of the third resistor string 113 and the fourth resistor string 114.

In one aspect, when the first signal SIN+, the second signal COS+, the third signal SIN− and the fourth signal COS− have a first phase shift from an index signal (e.g., referring to FIG. 7), the first amplifier 115 is coupled to the first resistor string 111 and the second resistor string 112 via 2×(M+1) tape-out nodes among the 4×(M+1) tape-out nodes, and the second amplifier 116 is coupled to the third resistor string 113 and the fourth resistor string 114 via the rest 2×(M+1) tape-out nodes among the 4×(M+1) tape-out nodes.

Since there is the first phase shift, a first tape-out node of the first resistor string 111 and a second tape-out node of the second resistor string 112 coupled to the first amplifier 115 are not at a tape-out node having no phase delay (i.e. not at N1), and a third tape-out node of the third resistor string 113 and a fourth tape-out node of the fourth resistor string 114 coupled to the second amplifier 116 are not at a tape-out node having no phase delay (i.e. not at N1).

Similarly, if there is the first phase shift, the phase-corrected tape-out signals have an attenuation, e.g., referring to FIG. 8. Therefore, the first feedback resistor Rf1 and the second feedback resistor Rf2 are adjusted to change a gain thereof to compensate tap-out signals attenuated by the first, second, third and fourth resistor strings. The arrangement of values of Rf1/Rin1, Rf1/Rin2, Rf2/Rin3 and Rf2/Rin4 has been illustrated above, and thus details thereof are not repeated herein.

In another aspect, when the first signal SIN+ and the third signal SIN− have a second phase shift from the second signal COS+ and the fourth signal COS− (e.g., referring to FIG. 10), in the case that only the first signal SIN+ and the third signal SIN− or only the second signal COS+ and the fourth signal COS− are corrected, the first amplifier 115 is coupled to the first resistor string 111 and the second resistor string 112 via 2×M×N tape-out sub-nodes among the 4×M×N tape-out sub-nodes, or the second amplifier 116 is coupled to the third resistor string 113 and the fourth resistor string 114 via the rest 2×M×N tape-out sub-nodes among the 4×M×N tape-out sub-nodes.

As mentioned above, the corrected tape-out signals are attenuated by the resistor strings through which they pass, and thus one of the first feedback resistor Rf1 and the second feedback resistor Rf2 is adjusted to change a gain thereof to compensate tap-out signals attenuated by the first and second resistor strings or by the third and fourth resistor strings. Similarly, when all of the first signal SIN+, the second signal COS+, the third signal SIN− and the fourth signal COS− are corrected, the gains of both of the first amplifier 115 and the second amplifier 116 are adjusted. The setting of values of Rf1/Rin1, Rf1/Rin2, Rf2/Rin3 and Rf2/Rin4 has been illustrated above, and thus details thereof are not repeated herein.

Figure 12:
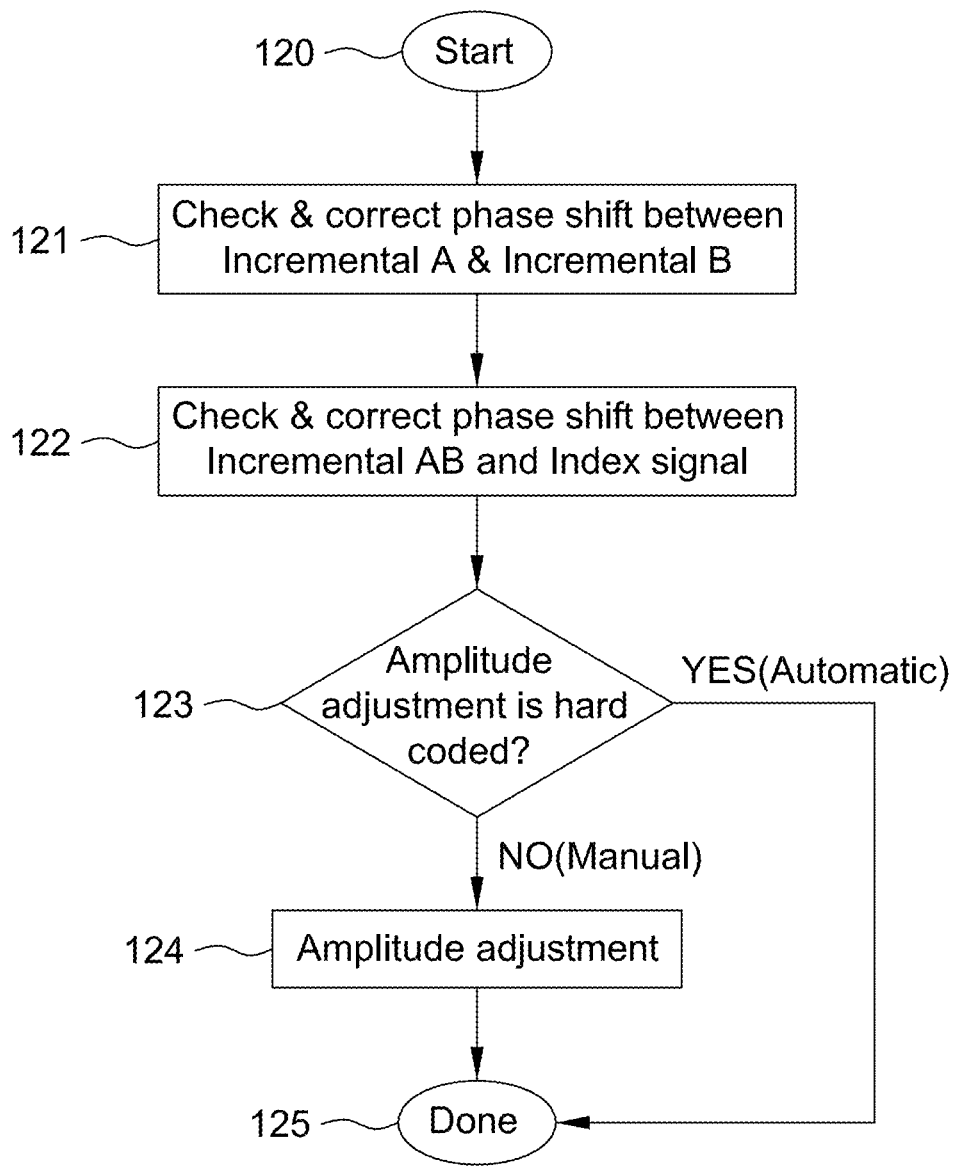
FIG. 12 is a flow chart of an operating method of the phase shifter circuit shown in FIG. 11.

Please refer to FIG. 12, it is a flow chart of an operating method of the phase shifter circuit 1100 shown in FIG. 11, including the steps of: starting phase correct (Step S120); checking and correcting a second phase shift between incremental signals CHA and CHB (Step S121); checking and correcting a first phase shift between incremental signals CHAB and an index signal (Step S123); checking whether an amplitude adjustment is hard coded or not (Step S123); if yes, automatically performing the amplitude adjustment and moving to Step S125; if no, manually performing the amplitude adjustment (Step S124). Referring to FIG. 4 again, details of the operating method are described hereinafter.

Step S120: The photodiodes 43 generate a first signal SIN+, a second signal COS+, a third signal SIN−, a fourth signal COS− and an index signal. The optical encoder 400 generates a first incremental signal CHA and a second incremental signal CHB by a comparator in the phase shifter circuit 45 or in the processor 47, and calculates a first phase shift between CHAB and the index signal, and a second phase shift between CHA and CHB. For example, it is assumed that the first phase shift is 45 degrees (e.g., referring to FIG. 7) and the second phase shift is 4 degrees (e.g., SIN+ and SIN− lagging COS+ and COS− by 86 degrees).

Step S121: The processor 47 of the optical encoder 400 checks a second phase shift between the first incremental signal CHA and the second incremental signal CHB; and selects a first sub-switching device among the M×N sub-switching devices of the first and second resistor strings or selecting a second sub-switching device among the M×N sub-switching devices of the third and fourth resistor strings to compensate the second phase shift. For example, the processor 47 selects the sub-switching device SW #_3A (assuming each resistor section of R1, R2, R3 and R4 having 2-degree phase delay) and the switching device SW #1B to correct the second phase shift, wherein the symbol "#" herein refers to that a number is not determined yet.

Step S122: The processor 47 then checks a first phase shift between the first and second incremental signals CHAB and an index signal; and conducts a first switching device among the (M+1) switching devices of the third and fourth resistor strings to compensate the first phase shift and conducts the first sub-switching device associated with the first switching device, or conducts a second switching device among the (M+1) switching devices of the first and second resistor strings to compensate the first phase shift and conducts the second sub-switching device associated with the second switching device. For example, the processor 47 conducts the sub-switching device SW3_3A (generating 49° phase delay on the first and third signals) and the switching device SW3_1B (generating 45° phase delay on the second and fourth signals) such that both the first phase shift and the second phase shift are corrected.

Step S123: As mentioned above, phase-corrected tape-out signals are attenuated by the resistor strings, and thus the first amplifier 111 and/or the second amplifier 112 are used to change a gain thereof to compensate an amplitude attenuation, which has been described above and thus is not repeated again.

Step S123-S125: If the amplitude adjustment is hard coded, i.e. conducting each switching device and sub-switching device having predetermined Rf1 and Rf2 values, the amplitude adjustment of Rf1 and Rf2 is automatically performed by the phase shifter circuit 1100.

Step S124: If the amplitude adjustment is not hard coded, the amplitude adjustment of Rf1 and Rf2 needs to be performed manually to cause the phase-corrected tape-out signals to be amplified to have amplitudes substantially identical to those of the first, second, third and fourth signals.

That is, if there is any conducted switching device not at a tape-out node having no phase delay (i.e. N1), the operating method includes a step of amplifying tape-out signals attenuated by the first, second, third and fourth resistor strings using a first amplifier 115 coupled to the first and second resistor strings and a second amplifier 116 coupled to the third and fourth resistor strings.

It should be mentioned that a sequence of the Steps S121 and S122 is changeable, i.e. switching devices for correcting the first phase shift are selected at first and then sub-switching devices for correcting the second phase shifted are conducted. In another aspect, the Steps S121 and S122 performed simultaneously.

It should be mentioned that the first, second, third and fourth signals are not limited to SIN+, COS+, SIN− and COS− mentioned herein as long as they sequentially having a 90-degree phase shift.

In the present disclosure, the first phase shift and the second phase shift are calculated according to CHAB and the index signal, or according to the first, second, third and fourth signals and the index signal by the processor 47.

It should be mentioned that the first and second feedback resistors are not limited to be adjustable.

It should be mentioned that although each resistor string is described by using four cascaded resistors, it is only intended to illustrate but not to limit the present disclosure. A number of the cascaded resistors (i.e. M) is determined according to a minimum phase to be delayed. For example, if the minimum delayed phase is 11.25°, eight cascaded resistors are used in each resistor string, including 0.166×Z, 0.127×Z, 0.108×Z, 0.99×Z, 0.99×Z, 0.108×Z, 0.127×Z and 0.166×Z corresponding to a delayed phase=11.25°, 22.5°, 33.75°, 45°, 56.25°, 67.5° and 78.75°, wherein Z is a positive value which is determined according to usable resistance in the phase shifter circuit. Each of the cascaded resistors is determined similar to equation (1) and Table I mentioned above, and thus details thereof are not described.

It should be mentioned that although one index signal is shown in the present disclosure, it is only intended to illustrate but not to limit the present disclosure. According to different application requirement, the optical encoder 400 of the present disclosure may output more than one index signal, i.e. having more than on index slit.

It should be mentioned that although the above embodiments are described in the way that the incremental signals are phase-shifted by using resistor strings such as shown in FIGS. 6 and 11, the present disclosure is not limited thereto. In another aspect, the phase shift induced by using the resistor strings is also applicable to absolute signals, such as the index signals. That is, the resistor strings for correcting the phase deviation described herein is adaptable to not only the incremental encoder but also the absolute encoder.

As mentioned above, it is known that there is a phase shift between incremental AB signals and an index signal or between incremental AB signals due to spatial offsets of components of an optical encoder. Accordingly, the present disclosure further provides a phase shifter circuit (e.g., FIGS. 6 and 11) and an operating method of the phase shifter circuit (e.g., FIG. 12). In the present disclosure, the phase shift is corrected by conducting the selected switching devices of each resistor string. Furthermore, a gain of an amplifier connected behind the resistor strings may be adjusted, automatically or manually, to compensate an attenuation of tape-out signals outputted from the resistor strings.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

The invention claimed is:

1. A phase shifter circuit of an optical encoder, the phase shifter circuit being configured to receive a first signal, a second signal, a third signal and a fourth signal sequentially having a 90-degree phase shift, the phase shifter circuit comprising:

a first resistor string, having M identical first resistors cascaded together, and two ends of the first resistor string configured to receive the first signal and the fourth signal, respectively;

a second resistor string, having M identical second resistors cascaded together, and two ends of the second resistor string configured to receive the third signal and the second signal, respectively;

a third resistor string, having M identical third resistors cascaded together, and two ends of the third resistor string configured to receive the second signal and the first signal, respectively;

a fourth resistor string, having M identical fourth resistors cascaded together, and two ends of the fourth resistor string configured to receive the fourth signal and the third signal, respectively;

4×(M+1) tape-out nodes, respectively located at one end of each of the M first resistors, the M second resistors, the M third resistors and the M fourth resistors;

a first amplifier, having two inputs respectively coupled to (M+1) tape-out nodes of the first resistor string and the second resistor string; and a second amplifier, having two inputs respectively coupled to (M+1) tape-out nodes of the third resistor string and the fourth resistor string, when the first signal, the second signal, the third signal and the fourth signal have a first phase shift from an index signal, the first amplifier is coupled to a first tape-out node of the first resistor string and a second tape-out node of the second resistor string, the second amplifier is coupled to a third tape-out node of the third resistor string and a fourth tape-out node of the fourth resistor string, and the first tape-out node, the second tape-out node, the third tape-out node and the fourth tape-out node are at a corresponding position of the first resistor string, the second resistor string, the third resistor string and the fourth resistor string to compensate for the first phase shift.

2. The phase shifter circuit as claimed in claim 1, wherein the first signal and the third signal are sine wave signals, and the second signal and the fourth signal are cosine wave signals.

3. The phase shifter circuit as claimed in claim 1, further comprising 4×(M+1) switching devices configured to couple the first amplifier to one tape-out node of the first resistor string and the second resistor string, and couple the second amplifier to one tape-out node of the third resistor string and the fourth resistor string.

4. The phase shifter circuit as claimed in claim 1, further comprising:

a first input resistor, coupled between a non-inverted input of the first amplifier and the first resistor string, a second input resistor, coupled between an inverted input of the first amplifier and the second resistor string, two first feedback resistors, respectively coupled between the non-inverted input and an inverted output and between the inverted input and a non-inverted output of the first amplifier, a third input resistor, coupled between a non-inverted input of the second amplifier and the third resistor string, a fourth input resistor, coupled between an inverted input of the second amplifier and the fourth resistor string, and two second feedback resistors, respectively coupled between the non-inverted input and an inverted output and between the inverted input and a non-inverted output of the second amplifier, wherein the first feedback resistor and the second feedback resistor are adjusted to change a gain thereof to compensate for tap-out signals attenuated by the first, second, third and fourth resistor strings.

5. The phase shifter circuit as claimed in claim 1, wherein the first tape-out node, the second tape-out node, the third tape-out node and the fourth tape-out node are not at a tape-out node having no phase delay.

6. The phase shifter circuit as claimed in claim 1, wherein when the first signal and the third signal have a second phase shift from the second signal and the fourth signal, the first amplifier is coupled to a first tape-out node of the first resistor string and a second tape-out node of the second resistor string, the second amplifier is coupled to a third tape-out node of the third resistor string and a fourth tape-out node of the fourth resistor string, and the first tape-out node and the second tape-out node are at a first corresponding position of the first resistor string and the second resistor string, and the third tape-out node and the fourth tape-out node are at a second corresponding position, different from the first corresponding first position, of the third resistor string and the fourth resistor string to compensate for the second phase shift.

7. The phase shifter circuit as claimed in claim 6, wherein the first tape-out node and the second tape-out node are at tape-out nodes having no phase delay, but the third tape-out node and the fourth tape-out node are at tape-out nodes having a phase shifting to compensate for the second phase shift, or the third tape-out node and the fourth tape-out node are at tape-out nodes having no phase delay, but the first tape-out node and the second tape-out node are at tape-out nodes having a phase shifting to compensate for the second phase shift.

8. The phase shifter circuit as claimed in claim 6, further comprising:

a first input resistor, coupled between a non-inverted input of the first amplifier and the first resistor string, a second input resistor, coupled between an inverted input of the first amplifier and the second resistor string, two first feedback resistors, respectively coupled between the non-inverted input and an inverted output and between the inverted input and a non-inverted output of the first amplifier, a third input resistor, coupled between a non-inverted input of the second amplifier and the third resistor string, a fourth input resistor, coupled between an inverted input of the second amplifier and the fourth resistor string, and two second feedback resistors, respectively coupled between the non-inverted input and an inverted output and between the inverted input and a non-inverted output of the second amplifier, wherein one of the first feedback resistor and the second feedback resistor is adjusted to change a gain thereof to compensate for tap-out signals attenuated by the first and second resistor strings or by the third and fourth resistor strings.

9. A phase shifter circuit of an optical encoder, the phase shifter circuit being configured to receive a first signal, a second signal, a third signal and a fourth signal sequentially having a 90-degree phase shift, the phase shifter circuit comprising:
    a first resistor string, having M identical first resistors cascaded together, and two ends of the first resistor string configured to receive the first signal and the fourth signal, respectively;
    a second resistor string, having M identical second resistors cascaded together, and two ends of the second resistor string configured to receive the third signal and the second signal, respectively;
    a third resistor string, having M identical third resistors cascaded together, and two ends of the third resistor string configured to receive the second signal and the first signal, respectively;
    a fourth resistor string, having M identical fourth resistors cascaded together, and two ends of the fourth resistor string configured to receive the fourth signal and the third signal, respectively;
    4×(M+1) tape-out nodes, respectively located at one end of each of the M first resistors, the M second resistors, the M third resistors and the M fourth resistors;
    4×M×N tape-out sub-nodes, respectively located within each of the M first resistors, the M second resistors, the M third resistors and the M fourth resistors;
    a first amplifier, having two inputs respectively coupled to (M+1) tape-out nodes or coupled to M×N tape-out sub-nodes of the first resistor string and the second resistor string; and
    a second amplifier, having two inputs respectively coupled to (M+1) tape-out nodes or coupled to M×N tape-out sub-nodes of the third resistor string and the fourth resistor string,
    wherein when the first signal, the second signal, the third signal and the fourth signal have a first phase shift from an index signal,
        the first amplifier is coupled to the first resistor string and the second resistor string via 2×(M+1) tape-out nodes among the 4×(M+1) tape-out nodes, and
        the second amplifier is coupled to the third resistor string and the fourth resistor string via the rest 2×(M+1) tape-out nodes among the 4×(M+1) tape-out nodes.

10. The phase shifter circuit as claimed in claim 9, wherein the first signal and the third signal are sine wave signals, and the second signal and the fourth signal are cosine wave signals.

11. The phase shifter circuit as claimed in claim 9, further comprising:
    4×(M+1) switching devices configured to perform coupling between the 4×(M+1) tape-out nodes and the first amplifier and the second amplifier; and
    4×M×N sub-switching configured to perform coupling between the 4×M×N tape-out sub-nodes and the first amplifier and the second amplifier.

12. The phase shifter circuit as claimed in claim 9, wherein
    a first tape-out node of the first resistor string and a second tape-out node of the second resistor string coupled to the first amplifier are not at a tape-out node having no phase delay, and
    a third tape-out node of the third resistor string and a fourth tape-out node of the fourth resistor string coupled to the second amplifier are not at a tape-out node having no phase delay.

13. The phase shifter circuit as claimed in claim 8, further comprising:
    a first input resistor, coupled between a non-inverted input of the first amplifier and the first resistor string,
    a second input resistor, coupled between an inverted input of the first amplifier and the second resistor string,
    two first feedback resistors, respectively coupled between the non-inverted input and an inverted output and between the inverted input and a non-inverted output of the first amplifier,
    a third input resistor, coupled between a non-inverted input of the second amplifier and the third resistor string,
    a fourth input resistor, coupled between an inverted input of the second amplifier and the fourth resistor string, and
    two second feedback resistors, respectively coupled between the non-inverted input and an inverted output and between the inverted input and a non-inverted output of the second amplifier,
    wherein the first feedback resistor and the second feedback resistor are adjusted to change a gain thereof to compensate for tap-out signals attenuated by the first, second, third and fourth resistor strings.

14. The phase shifter circuit as claimed in claim 11, wherein when the first signal and the third signal have a second phase shift from the second signal and the fourth signal,
    the first amplifier is coupled to the first resistor string and the second resistor string via 2×M×N tape-out sub-nodes among the 4×M×N tape-out sub-nodes, or
    the second amplifier is coupled to the third resistor string and the fourth resistor string via the rest 2×M×N tape-out sub-nodes among the 4×M×N tape-out sub-nodes.

15. The phase shifter circuit as claimed in claim 14, further comprising:
    a first input resistor, coupled between a non-inverted input of the first amplifier and the first resistor string,
    a second input resistor, coupled between an inverted input of the first amplifier and the second resistor string,
    two first feedback resistors, respectively coupled between the non-inverted input and an inverted output and between the inverted input and a non-inverted output of the first amplifier,
    a third input resistor, coupled between a non-inverted input of the second amplifier and the third resistor string,
    a fourth input resistor, coupled between an inverted input of the second amplifier and the fourth resistor string, and
    two second feedback resistors, respectively coupled between the non-inverted input and an inverted output and between the inverted input and a non-inverted output of the second amplifier,
    wherein one of the first feedback resistor and the second feedback resistor is adjusted to change a gain thereof to compensate for tap-out signals attenuated by the first and second resistor strings or by the third and fourth resistor strings.

16. An operating method of the phase shifter circuit as claimed in claim 11, the operating method comprising:
    generating a first incremental signal and a second incremental signal according to the first, second, third and fourth signals;
    checking a second phase shift between the first incremental signal and the second incremental signal;
    selecting a first sub-switching device among M×N sub-switching devices of the first and second resistor strings or selecting a second sub-switching device among M×N sub-switching devices of the third and fourth resistor strings to compensate for the second phase shift;

checking a first phase shift between the first and second incremental signals and an index signal; and conducting a first switching device among (M+1) switching devices of the third and fourth resistor strings to compensate for the first phase shift and the first sub-switching device associated with the first switching device, or conducting a second switching device among (M+1) switching devices of the first and second resistor strings to compensate for the first phase shift and the second sub-switching device associated with the second switching device.

17. The operating method as claimed in claim 16, further comprising:

amplifying tape-out signals attenuated by the first, second, third and fourth resistor strings using a first amplifier coupled to the first and second resistor strings and a second amplifier coupled to the third and fourth resistor strings.

18. The operating method as claimed in claim 16, wherein the first signal and the third signal are sine wave signals, and the second signal and the fourth signal are cosine wave signals.

* * * * *